(12) United States Patent
Huang et al.

(10) Patent No.: US 7,810,645 B2
(45) Date of Patent: Oct. 12, 2010

(54) PADDLE FOR SECURELY MOUNTING A WAFER CASSETTE HOLDER THERETO

(75) Inventors: Chih-Hung Huang, Mil-Lie (TW); Ching-Chiang Chang, Hsin-Chu (TW); Yu-Yen Chang, Taipei (TW); Pei-Yi Kuo, Tainan (TW); Kuo-Chen Lin, Hsing-Chu (TW); Chung-Yi Lee, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 912 days.

(21) Appl. No.: 10/190,054

(22) Filed: Jul. 3, 2002

(65) Prior Publication Data

US 2004/0004167 A1 Jan. 8, 2004

(51) Int. Cl.
*B65D 85/00* (2006.01)

(52) U.S. Cl. ............ 206/710; 248/678; 248/680; 248/346.03; 206/711; 269/302.1; 414/941; 414/937

(58) Field of Classification Search ............ 248/346.03, 248/346.06, 346.04, 346.5, 678, 480, 346.01; 248/346.07, 680, 178.1; 414/411, 217, 446, 414/786, 217.1, 805, 810, 940, 937, 938, 414/939; 206/711, 710, 453, 565; 269/302.1, 269/289 R, 53, 291; 220/737, 323, 784, 220/799; 369/134, 136, 138, 139, 145, 146, 369/153, 156, 120, 121, 119
See application file for complete search history.

(56) References Cited

U.S. PATENT DOCUMENTS

| | | | | |
|---|---|---|---|---|
| 648,763 A * | 5/1900 | Barge | ............................ | 30/436 |
| 1,490,608 A * | 4/1924 | Gilmour | ..................... | 269/104 |
| 2,094,225 A * | 9/1937 | Tuttle | ........................... | 82/172 |
| 2,921,785 A * | 1/1960 | Underhill | ..................... | 269/218 |
| 3,345,030 A * | 10/1967 | Speers | .................... | 248/346.03 |
| 4,332,362 A * | 6/1982 | Leopold | ................. | 248/229.26 |
| 4,744,712 A * | 5/1988 | Mitchell | ..................... | 414/217 |
| 4,762,353 A * | 8/1988 | Molinaro | .................... | 294/1.1 |
| 4,915,033 A * | 4/1990 | Bond | ........................ | 108/55.1 |
| 5,167,405 A * | 12/1992 | Cayley, Jr. | .................. | 269/309 |
| 5,246,218 A * | 9/1993 | Yap et al. | ..................... | 269/309 |
| 5,398,898 A * | 3/1995 | Bever | .......................... | 248/154 |
| 5,628,683 A * | 5/1997 | Gentischer | .................... | 454/187 |
| 5,653,565 A * | 8/1997 | Bonora et al. | ................ | 414/411 |
| 6,152,669 A * | 11/2000 | Morita et al. | ................ | 414/217 |
| 6,416,719 B1 * | 7/2002 | Fawcett | ....................... | 422/104 |
| 6,432,849 B1 * | 8/2002 | Endo et al. | .................. | 438/800 |
| 6,764,272 B1 * | 7/2004 | Nuxoll et al. | ............... | 414/754 |

* cited by examiner

Primary Examiner—Kimberly T Wood
(74) Attorney, Agent, or Firm—Tung & Associates

(57) ABSTRACT

A platform for securely mounting a wafer cassette holder thereon is provided which includes a wafer cassette holder that has a flat bottom surface and four sidewall panels, a platform that has a flat top surface larger than and for mating to the flat bottom surface of the wafer cassette holder, And a securing device mounted in the flat top surface of the platform juxtaposed to each side of the four sidewalls of the wafer cassette holder for preventing the holder from accidentally slipping off the platform, the securing device may include either a plurality of engagement pins that slidingly engages the wafer cassette holder for securely holding the holder on the platform, or a plurality of side panels mounted along the peripheral edge of the platform for preventing the holder from slipping off the platform.

14 Claims, 3 Drawing Sheets

PADDLE FOR SECURELY MOUNTING A WAFER CASSETTE HOLDER THERETO

FIELD OF THE INVENTION

The present invention generally relates to an apparatus and a method for securely mounting a wafer cassette holder on a platform and more particularly, relates to an apparatus and a method for securely mounting a wafer cassette holder to an I/O (input/output) pedal without the risk of damaging the wafer cassette holder during the transfer into or out of a stocker.

BACKGROUND OF THE INVENTION

In the manufacturing of an IC product, a wafer is processed at many work stations or processing machines. The transporting or conveying of partially finished products, or work-in-process (WIP) parts, is an important aspect of the total manufacturing process. The conveying of semiconductor wafers is especially important in the manufacturing of integrated circuit (IC) chips due to the delicate nature of the chips. Furthermore, in fabricating an IC product, a multiplicity of fabrication steps, i.e. as many as several hundred, is required to complete the fabrication process. A semiconductor wafer or IC chips must be transported between various process stations in order to perform various fabrication processes.

For instance, to complete the fabrication of an IC chip, various steps of deposition, cleaning, ion implantation, etching and passivation steps must be carried out before a chip is packaged for shipment. Each of these fabrication steps must be performed in a different process machine, i.e., a chemical vapor deposition chamber, an ion implantation chamber, an etcher, etc. A partially processed semiconductor wafer must be conveyed between various work stations many times before the fabrication process is completed. The safe conveying and accurate tracking of such semiconductor wafers or work-in-process parts in a fabrication facility is therefore an important aspect of the total fabrication process.

Conventionally, partially finished semiconductor wafers or WIP parts are conveyed in a fabrication plant by automatically guided vehicles or by overhead transport vehicles that travel on predetermined routes or tracks. For the conveying of semiconductor wafers, the wafers are normally loaded into cassettes or SMIF pods and then picked up and placed in the automatic conveying vehicles. For identifying and locating the various semiconductor wafers or WIP parts being transported, the cassettes or pods are normally labeled with a tag positioned on the side of the cassette or pod. The tags can be read automatically by a tag reader that is mounted on the guard rails of the conveying vehicle.

In an automatic material handling system (AMHS), stockers are widely used in conjunction with automatically guided or overhead transport vehicles, either on the ground or suspended on tracks, for the storing and transporting of semiconductor wafers in SMIF pods or in wafer cassettes. For instance, as shown in FIG. 1, three possible configurations for utilizing a stocker are illustrated. In case A, a stocker 10 is utilized for storing WIP wafers in SMIF pods and transporting them first to tool A, then to tool B, and finally to tool C for three separate processing steps to be conducted on the wafers. After the processing in tool C is completed, the SMIF pod is returned to stocker 10 for possible conveying to another stocker. The configuration shown in case A is theoretically workable but hardly ever possible in a fabrication environment since the tools or processing equipment cannot always be arranged nearby to accommodate the processing of wafers in stocker 10.

In the second configuration of case B shown in FIG. 1, stocker 12 and a plurality of buffer stations A, B and C are used to accommodate different processes to be conducted in tool A, tool B and tool C. As shown in FIG. 1, a SMIF pod may be first delivered to buffer station A from stocker 12 and waits there for processing in tool A. Buffer stations B and C are similarly utilized in connection with tools B and C. The buffer stations A, B and C therefore become holding stations for conducting processes on the wafers. This configuration provides a workable solution to the fabrication process, however, requires excessive floor space because of the additional buffer stations required. The configuration is therefore not feasible for use in a semiconductor fabrication facility.

In the third configuration shown as case C in FIG. 1, stocker 14 is provided for controlling the storage and conveying of WIP wafers to tools A, B and C. It is seen that after a SMIF pod is delivered to one of the three tools, the SMIF pod is always returned to stocker 14 before it is sent to the next processing tool. This is a viable process since only one stocker is required for handling three different processing tools and that no buffer station is needed. The configuration shown in case C illustrates that the frequency of use of the stocker is extremely high since the stocker itself is used as a buffer station for all three tools. The accessing of stocker 14 is therefore much more frequent than that required in the previous two configurations.

In modern semiconductor fabrication facilities, especially for the 200 mm or 300 mm FAB plants, automatic guided vehicles (AGV) and overhead transport vehicles (OHT) are extensively used to automate the wafer transport process as much as possible. The AGE and OHT utilize the input/output ports of a stocker to load or unload wafer lots, i.e., normally stored in SMIF pods.

An automatic guided vehicle (AGV) system used in a conventional stocker configuration is shown in FIG. 2. The AGV system 48 consists of two automatic guided vehicles 50 and 52 with vehicle 52 stopped in front of the stocker 30. The stocker 30 is equipped with an input port 54 and an output port 56. As shown in FIG. 2, the automatic guided vehicle 52 approaches the output port 56 for accepting an output from stocker 30, however, at the same time, the input port 54 is also blocked by vehicle 52 such that the second vehicle 50 must wait for input until vehicle 52 has moved out of the way.

During the transfer of a wafer cassette holder, i.e. the transfer of a SMIF pod into or out of an input port 54 or an output port 56 of a stocker 30, an I/O port paddle or platform (not shown) of conventionally design does not have any provision for fixing the SMIF pod in place and preventing the pod from slipping off the platform. It is therefore possible that the wafer cassette holder, or the SMIF pod may be damaged during such pod transfer process. Furthermore, there is no securing means on the paddle or platform, a clean room operator may mistakenly swap pods between paddles which leads to database inconsistency in an automatic material handling system (AMHS). It is therefore desirable to provide a securing means on a paddle or platform in a stocker to secure the position of a SMIF pod on the paddle for preventing damages to the pod, or preventing damages to the wafer stored therein, and for preventing database inconsistency in the AMHS.

It is therefore an object of the present invention to provide a platform for securely mounting a wafer cassette holder thereon that does not have the drawbacks or shortcomings of conventional platforms.

It is another object of the present invention to provide an I/O port paddle in a stocker for securely mounting a SMIF pod thereon without the possibility of damaging the pod or the wafers contained therein.

It is a further object of the present invention to provide a paddle for securely mounting a wafer cassette holder thereon by using securing means on the paddle surface for fixing the position of the wafer cassette holder.

It is another further object of the present invention to provide a platform for securely mounting a wafer cassette holder thereon by incorporating a securing means on a top surface of the platform juxtaposed to each of the four sidewalls of the wafer cassette holder.

It is still another object of the present invention to provide a platform for securely mounting a wafer cassette holder thereon by utilizing a securing means of engagement pins that are mounted on each side of the top surface of the platform.

It is yet another object of the present invention to provide a platform for securely mounting a wafer cassette holder thereon by utilizing a securing means of side panels mounted on each side of the top surface of the platform.

It is still another further object of the present invention to provide a method for preventing a wafer cassette holder from slipping off a cassette holder platform by utilizing securing means on the surface of the platform.

It is yet another further object of the present invention to provide a method for preventing a wafer cassette holder from being accidentally moved from a wafer cassette holder platform by engaging securing means to fix the position of the holder on the platform.

SUMMARY OF THE INVENTION

In accordance with the present invention, an apparatus and a method for securely mounting a wafer cassette holder on a cassette holder platform for preventing the holder from accidentally falling off the platform are provided.

In a preferred embodiment, a platform for securely mounting a wafer cassette holder thereon is provided which includes a wafer cassette holder that has a flat bottom surface and four sidewall panels mounted substantially perpendicular to the bottom surface, a platform that has a flat top surface larger than and for mating to the flat bottom surface of the wafer cassette holder, and a securing means mounted in the flat top surface of the platform juxtaposed to each side of the four sidewalls of the wafer cassette holder for preventing the wafer cassette holder from slipping off the platform.

In the platform for securely mounting a wafer cassette holder thereto, the securing means may include engagement pins or side panels. The securing means may further include one engagement pin mounted on each one of four sides of the flat top surface of the platform. Each of the engagement pins may be mounted in a slot opening for sliding engagement between a disengaged position and an engaged position. Each of the engagement pins may be mounted in a slot opening and operated by a connecting rod for switching between an engaged position and a disengaged position. The securing means may include side panels mounted on each one of the four sides of the flat top surface of the platform. Each of the side panels may have a bottom edge portion of reduced thickness for frictionally engaging an elongated slot provided along an edge of each of the four sides of the flat top surface of the platform. Each of the side panels may have a height protruding above the flat top surface of the platform by at least 0.5 cm. Each of the side panels may have a bottom edge equipped with at least two pegs each for frictionally engaging one of the at least two apertures provided in the top surface of the platform to allow the side panels to be vertically mounted to the top surface of the platform. Each of the side panels may have a height protruding above the flat top surface of the platform preferably by at least 1 cm.

The present invention is further directed to a method for preventing a wafer cassette holder from slipping off a wafer cassette holder platform which can be carried out by the operating steps of first providing a platform that has a flat bottom surface larger than and for mating to a bottom surface of a generally square-shaped wafer cassette holder, the wafer cassette holder may have a flat bottom surface for engaging the flat bottom surface of the platform, then providing a securing means juxtaposed to each side of the generally square-shaped wafer cassette holder in the flat top surface of the platform, and engaging the securing means to the wafer cassette holder to prevent movement of the wafer cassette holder on the platform.

The method for preventing a wafer cassette holder from slipping off a wafer cassette holder platform may further include the step of engaging the securing means of engagement pins or side panels to the wafer cassette holder. The method may further include the step of engaging securing means of engagement pins mounted on each one of four sides of the flat top surface of the platform. The method may further include the step of engaging the engagement pins mounted in slot openings in the flat top surface of the platform for slidingly engaging the wafer cassette holder from a disengaged position to an engaged position, or the step of engaging the engagement pins mounted in slot openings in the flat top surface of the platform by operating a connecting rod to switch from a disengaged position to an engaged position. The method may further include the step of engaging the securing means of side panels to each one of four sides of the flat top surface of the platform, or the step of frictionally engaging bottom edge portions of reduced thickness of the side panels to elongated slots provided along edges of the four sides in the flat top surface of the platform. The method may further include the step of providing the side panels in such a height that the side panels protrude above the flat top surface of the platform by at least 0.5 cm, or preferably by at least 1 cm. The method may further include the step of providing the side panels with a bottom edge equipped with at least two pegs each for frictionally engaging one of at least two apertures provided in the top surface of the platform such that the side panels mount vertically on the top surface of the platform.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses an apparatus and a method for securely mounting a wafer cassette holder to a wafer cassette holder platform, or to an I/O port paddle of a stocker without the danger of having the holder slipping off the platform. The apparatus utilizes a securing means of engagement pins or side panels that are mounted to the top surface of the platform along the edges. For instance, when a wafer cassette holder that has a flat bottom surface and four sidewalls is positioned on a flat top surface of a platform, the flat bottom surface mates to the flat top surface with a securing means mounted juxtaposed to and surround the wafer cassette holder to prevent the holder from slipping off the platform.

The invention is further directed to a method for preventing a wafer cassette holder from slipping off a wafer cassette holder platform by engaging a securing means provided in a top surface of the platform to the wafer cassette holder such that any movement of the holder on the platform can be prevented. The present invention novel method therefore prevents any possible damage to the wafers stored in the wafer cassette holder and furthermore, prevents the accidental removal and repositioning of the wafer cassette holder onto another platform having a different identification tag.

Figure 1:
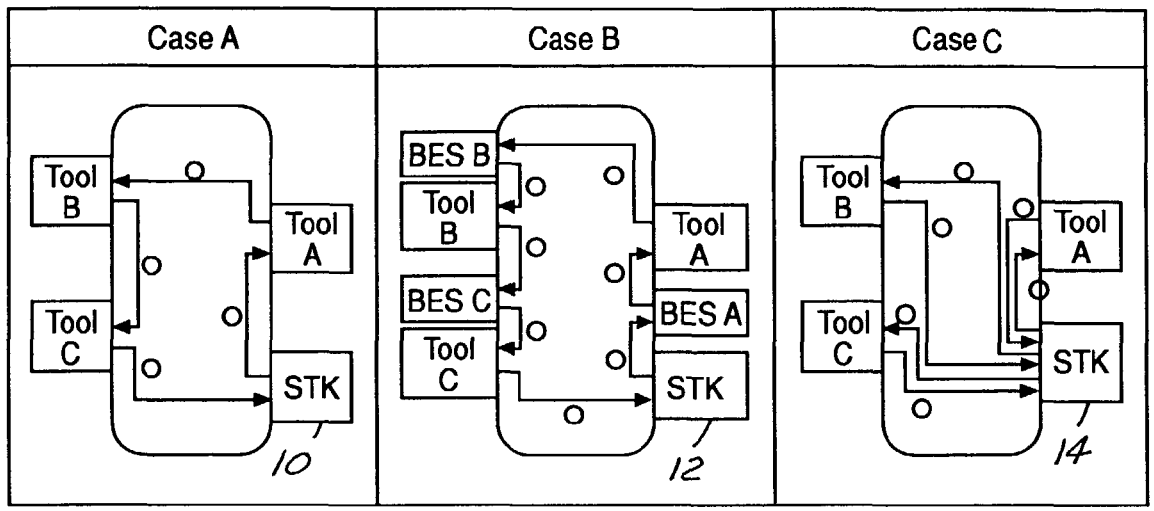
FIG. 1 is a schematic of three different configurations for connecting a stocker to a processing tool.
Figure 2:
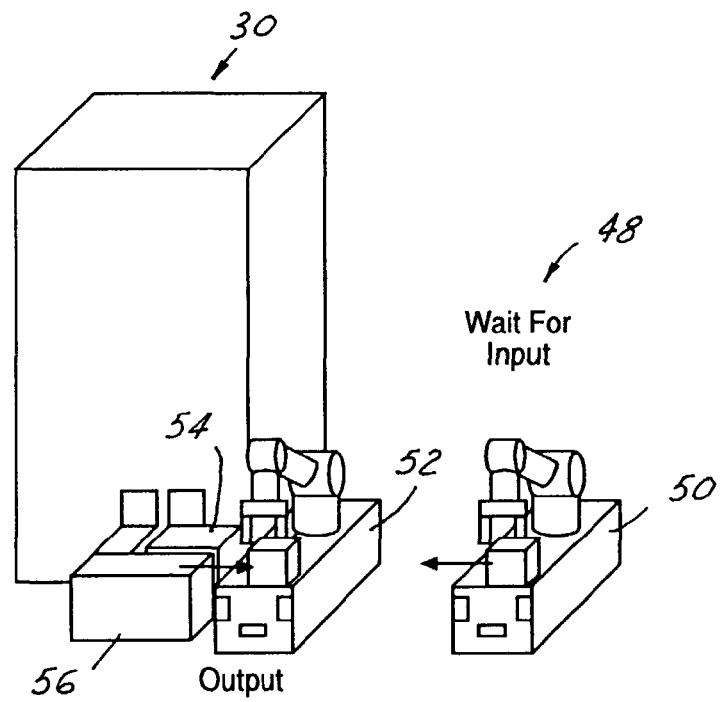
FIG. 2 is a schematic illustrating a conventional automated guided vehicle system for accessing a stocker.
Figure 3A:
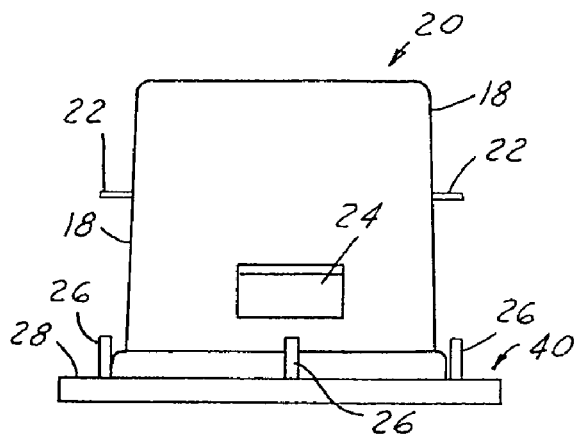
FIG. 3A is a front view of a wafer cassette holder mounted on a platform utilizing the present invention securing means of engagement pins.
Figure 3B:
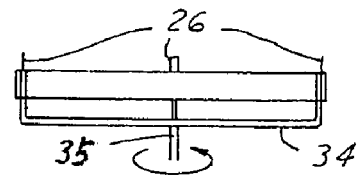
FIG. 3B is a side view of the platform of FIG. 3A illustrating the engagement pins and the connecting rod for operating the pins.

Referring initially to FIG. 3A wherein a front view of a wafer cassette holder 20 situated on a platform 40 is shown. The wafer cassette holder 20, i.e. the SMIF pod is further equipped with manually operable handles 22 and an identification tag 24 for reading by an automated tag reader into a data base. The platform 40 is equipped with a plurality of engagement pins 26 mounted in a top surface 28 of the platform 40. The movement of the engagement pins 26, which may be aided by a spring biased action, is accomplished by connecting rod 34, as shown in FIG. 3B.

Figure 3C:
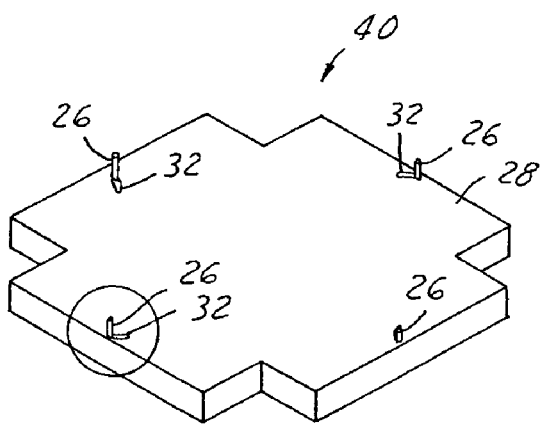
FIG. 3C is a perspective view of the platform of FIG. 3A equipped with present invention securing means of engagement pins.
Figure 3D:
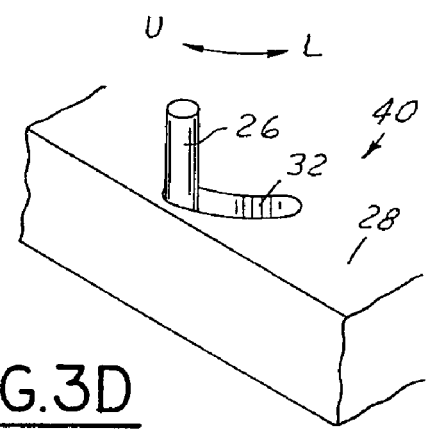
FIG. 3D is an enlarged view of the engagement pins of FIG. 3C.

A perspective view of the platform 40 including the plurality of engagement pins 26 mounted in slot openings 32 is further shown in FIG. 3C. The slot openings 32 are formed in an arcuate shape having a predetermined arc such that the engagement pins 26 can be slidingly moved in the opening. A detailed view of an engagement between an engagement pin 26 and a slot opening 32 mounted in a present invention platform 40 is shown in FIG. 3D. As indicated, the engagement pin 26 which is operable by the connecting Rod 34 (shown in FIG. 3B) can be switched from an unlocked position U (shown in FIG. 3D) to a locked position L when the connecting rod 34 is turned by shaft 35. The connecting rod 34 is connected to all four engagement pins 26, as shown in FIG. 3B, such that all four pins can be operated at the same time when shaft 35 is turned either counterclockwise to engage the pins 26 with the wafer cassette holder 20 (locked position) or to disengage, by turning in a clockwise direction (unlocked position). This is shown in FIGS. 3D, 3E and 3F.

Figure 3E:
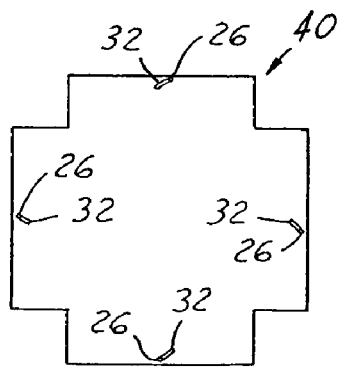
FIG. 3E is a plane view of the platform of FIG. 3A illustrating the present invention engagement pins in a disengaged position.
Figure 3F:
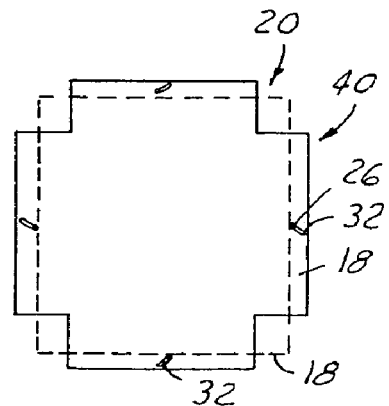
FIG. 3F is a plane view of the platform of FIG. 3A illustrating the engagement pins in an engaged position with a wafer cassette holder (shown in ghost lines).

FIG. 3E is a plane view of the platform 40 with the engagement pins 26 situated in a disengaged position. FIG. 3F is a plane view of the platform 40 with the engagement pins 26 displaced in the slot opening 32 to an engaged position for engaging the wafer cassette holder (shown in ghost lines). At the engaged position, the wafer cassette holder 20 is secured by a frictional engagement between the engagement pins 26 and the sidewalls 18 of the holder. The movement of the engagement pins 26 can further be aided with a spring such that the frictional engagement between the pins 26 and the sidewalls 18 can be improved. A suitable dimension of the engagement pins 26 is between about 1 mm and about 3 mm in diameter, and a height protruding above the top surface 28 of platform 40 between about 5 mm and about 20 cm.

Figure 4A:
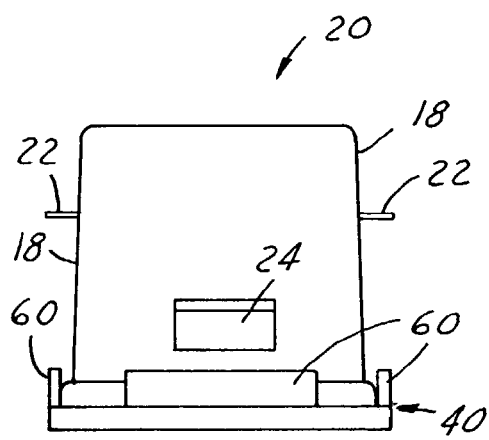
FIG. 4A is a front view of a wafer cassette holder mounted on a platform equipped with a present invention securing means of side panels.
Figure 4B:
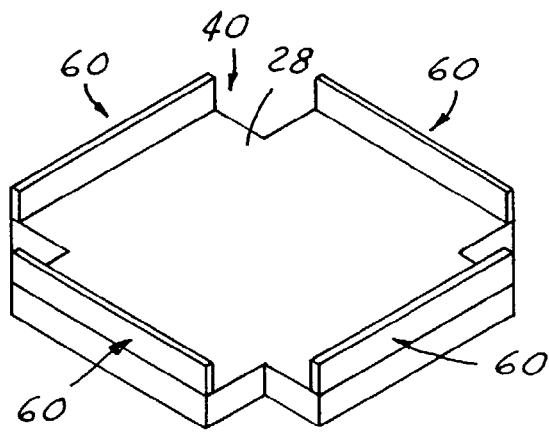
FIG. 4B is a perspective view of the platform of FIG. 4A equipped with the present invention side panels.

In another preferred embodiment of the present invention, side panels 60 are utilized as the securing means. This is shown in FIGS. 4A, 4B, 4C and 4D. FIG. 4A is a front view of a wafer cassette holder 20 positioned on a platform 40 and held in place by the present invention securing means of side panels 60. A total of four side panels 60 are shown in a prospective view of the platform 40 in FIG. 4B.

Figure 4C:
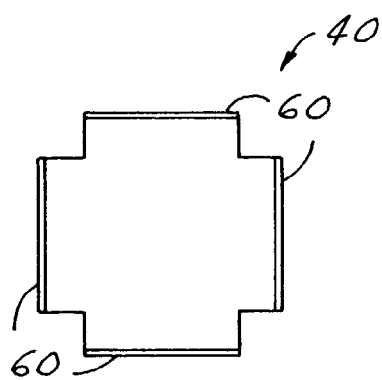
FIG. 4C is a plane view of the platform of FIG. 4A equipped with the present invention side panels.
Figure 4D:
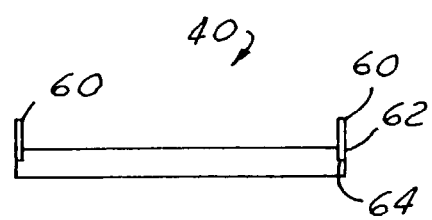
FIG. 4D is a cross-sectional view of the platform of FIG. 4A illustrating the mounting method for the side panels.

A suitable dimension for the side panels 60 may be between about 2 mm and about 5 mm in thickness, and between about 5 mm and about 30 mm in height that protrudes above the top surface 28 of the platform 40. A plane view of the platform 40 with the side panels 60 installed thereon is shown in FIG. 4C. A cross-sectional view taken along the center of platform 40 is shown in FIG. 4D. As shown in FIG. 4D, a bottom edge portion 62 of the side panel 60 which has a reduced thickness is frictionally mounted into slot opening 64 provided in the platform 40. The frictional engagement allows the side panel 60 to be easily mounted or removed for service or cleaning.

The present invention novel device and a method for utilizing the device in order to prevent the accidental sliding off of a wafer cassette holder from a wafer cassette platform, or from an I/O port paddle of a stocker have therefore been amply described in the above description and in the appended drawings of FIGS. 3A-4D.

While the present invention has been described in an illustrative manner, it should be understood that the terminology used is intended to be in a nature of words of description rather than of limitation.

Furthermore, while the present invention has been described in terms of a preferred and alternate embodiment, it is to be appreciated that those skilled in the art will readily apply these teachings to other possible variations of the inventions.

The embodiment of the invention in which an exclusive property or privilege is claimed are defined as follows.

What is claimed is:

1. A platform securely mounting a wafer cassette holder thereon in a semiconductor manufacturing environment comprising:

a platform having a flat top surface larger than and engaging with a flat bottom surface of said wafer cassettes holder, and securing means mounted in said flat top surface of the platform, said securing means positionable to engage said wafer cassette holder to prevent said wafer cassette holder from slipping off said platform, wherein said securing means comprises one engagement pin mounted on each one of four sides of said flat top surface of the platform, and each of said engagement pins being mounted in a slot opening disposed within said flat top surface, said engagement pins adapted to simultaneously frictionally engage and simultaneously disengage said wafer cassette holder by simultaneously slidingly moving the pins in said slot opening between a disengaged position and an engaged position, said frictional engagement between each of said engagement pins and a sidewall of said wafer cassette holder.

2. A platform securely mounting a wafer cassette holder thereon according to claim 1, wherein said slot opening is arc shaped.

3. A platform securely mounting a wafer cassette holder thereon according to claim 1, wherein each of said engagement pins being mounted in the slot opening are connected to a connecting rod, said connecting rod adapted to simultaneously move each of said engagement pins between said disengaged position and said engaged position.

4. A platform securely mounting a wafer cassette holder thereon according to claim 3, further comprising a rotatable shaft connected to said connecting rod, said rotatable shaft adapted to move said connecting rod upon rotation of said rotatable shaft.

5. A method preventing a wafer cassette holder from slipping off a wafer cassette holder platform in a semiconductor manufacturing environment comprising:
providing a generally square-shaped wafer cassette holder, said wafer cassette holder having a flat bottom surface,
providing a platform having a flat top surface larger than and engaging with said flat bottom surface of said generally square-shaped wafer cassette holder,
providing a securing means in said flat top surface of the platform, said securing means positionable to engage said wafer cassette holder to prevent said wafer cassette holder from slipping off said platform, and
engaging said securing means to said wafer cassette holder to prevent movement of said wafer cassette holder on said platform,
said securing means comprising engagement pins, each engagement pin mounted in a respective slot opening disposed in each one of four sides within said flat top surface of said platform, said engagement pins adapted to simultaneously frictionally engage said wafer cassette holder by simultaneously slidingly moving the pins in said respective slot opening between a disengaged position and an engaged position, said frictional engagement between each of said engagement pins and a sidewall of said wafer cassette holder.

6. A method preventing a wafer cassette holder from slipping off a wafer cassette holder platform according to claim 5, wherein said slot opening is arc shaped.

7. A method preventing a wafer cassette holder from slipping off a wafer cassette holder platform according to claim 5 further comprising the step of engaging said engagement pins by operating a connecting rod, said connecting rod connected to each of said engagement pins, said connecting rod adapted to simultaneously move each of said engagement pins to switch from the disengaged position to the engaged position.

8. A method preventing a wafer cassette holder from slipping off a wafer cassette holder platform according to claim 7, further comprising a rotatable shaft connected to said connecting rod, said rotatable shaft adapted to move said connecting rod upon rotation of said rotatable shaft.

9. A platform securely mounting a wafer cassette holder thereon comprising:
a platform having a flat top surface larger than and engaging with a flat bottom surface of a generally square-shaped wafer cassette holder; and
a securing means mounted in said flat top surface of the platform, said securing means positionable to engage said wafer cassette holder to prevent said wafer cassette holder from slipping off said platform;
wherein said securing means comprises side panels mounted on each one of four sides of said flat top surface of the platform;
each of said side panels having a bottom edge portion of reduced thickness for frictionally engaging an elongated slot provided along an edge of each of said four sides of said flat top surface of the platform, each of said side panels positioned to engage sidewalls of said wafer cassette holder, said elongated slot in a direction substantially parallel to said side, respectively.

10. A platform securely mounting a wafer cassette holder thereon according to claim 9, wherein each of said side panels having a height protruding above said flat top surface of the platform by at least 0.5 cm.

11. A platform securely mounting a wafer cassette holder thereon according to claim 9, wherein each of said side panels having a height protruding above said flat top surface of the platform by at least 1 cm.

12. A method preventing a wafer cassette holder from slipping off a wafer cassette holder platform comprising:
providing a platform having a flat top surface larger than and adapted to engage with a flat bottom surface of a generally square-shaped wafer cassette holder;
providing a securing means in said flat top surface of the platform, said securing means positionable to engage said wafer cassette holder to prevent said wafer cassette holder from slipping off said platform;
wherein said securing means comprises side panels mounted on each one of four sides of said flat top surface of the platform;
each of said side panels having a bottom edge portion of reduced thickness for frictionally engaging an elongated slot provided along an edge of each of said four sides of said flat top surface of the platform, said elongated slot in a direction substantially parallel to said side, respectively; and
frictionally engaging said bottom edge portions of reduced thickness to said elongated slots to thereby engage sidewalls of said wafer cassette holder.

13. A method preventing a wafer cassette holder from slipping off a wafer cassette holder platform according to claim 12 further comprising the step of providing said side panels in such a height that the side panels protrude above said flat top surface of the platform by at least 0.5 cm.

14. A method preventing a wafer cassette holder from slipping off a wafer cassette holder platform according to claim 12 further comprising the step of providing said sidewall panels in such a height that the sidewall panels protrude above said flat top surface of the platform by at least 1 cm.

* * * * *